(12) United States Patent
Guzman et al.

(10) Patent No.: US 12,507,358 B2
(45) Date of Patent: Dec. 23, 2025

(54) SERVER RACK SYSTEM LATCH LOCKOUT

(71) Applicant: Dell Products L.P., Round Rock, TX (US)

(72) Inventors: Richard W. Guzman, Lago Vista, TX (US); Kevin Garrett, Austin, TX (US); David L. Roper, Austin, TX (US); Matthew B. Gilbert, Bend, OR (US); Jerry W. Haug, Lockhart, TX (US)

(73) Assignee: Dell Products L.P., Round Rock, TX (US)

( * ) Notice: Subject to any disclaimer, the term of this patent is extended or adjusted under 35 U.S.C. 154(b) by 436 days.

(21) Appl. No.: 18/101,240

(22) Filed: Jan. 25, 2023

(65) Prior Publication Data

US 2024/0251513 A1 Jul. 25, 2024

(51) Int. Cl.
*H05K 5/02* (2006.01)
*H05K 7/14* (2006.01)

(52) U.S. Cl.
CPC ......... *H05K 5/0221* (2013.01); *H05K 7/1487* (2013.01); *H05K 7/1492* (2013.01)

(58) Field of Classification Search
CPC .. H05K 5/0221; H05K 7/1401; H05K 7/1405; H05K 7/1421; H05K 7/1417; H05K 7/1487; H05K 7/1492; H05K 7/1489
See application file for complete search history.

(56) References Cited

U.S. PATENT DOCUMENTS

| | | | |
|---|---|---|---|
| 6,034,868 A * | 3/2000 | Paul | H05K 7/1448 361/679.02 |
| 6,373,707 B1 * | 4/2002 | Hutchins | G06F 1/183 211/41.17 |
| 10,251,482 B2 * | 4/2019 | Chen | H05K 7/1489 |
| 10,292,297 B2 * | 5/2019 | Chen | H05K 7/1489 |
| 11,058,219 B2 * | 7/2021 | Chen | H05K 7/1489 |
| 11,266,237 B2 * | 3/2022 | Chen | H05K 7/1489 |
| 11,553,627 B1 * | 1/2023 | Gregory | H05K 7/20781 |
| 2004/0227443 A1 * | 11/2004 | Sandoval | H05K 7/1411 312/334.44 |
| 2016/0324317 A1 * | 11/2016 | Chen | H05K 7/1489 |
| 2018/0125234 A1 * | 5/2018 | Chen | A47B 88/483 |
| 2021/0127827 A1 * | 5/2021 | Chen | A47B 96/07 |

* cited by examiner

*Primary Examiner* — Sagar Shrestha
(74) *Attorney, Agent, or Firm* — Terrile, Cannatti & Chambers, LLP; Stephen A. Terrile (57) ABSTRACT

A server power rack latch lockout component. The server power rack latch lockout component includes an attachment portion, the attachment portion being configured to be mounted to a side of a server rack and an actuation portion, the actuation portion engaging with a rack ear of a server type information handling system when the server type information handling system is attached to a server rack.

10 Claims, 11 Drawing Sheets

SERVER RACK SYSTEM LATCH LOCKOUT

BACKGROUND OF THE INVENTION

Field of the Invention

The present invention relates to information handling systems. More specifically, embodiments of the invention relate to server racks within information technology (IT) environments.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to use information handling systems and related IT systems within information technology (IT) environments such as data centers.

SUMMARY OF THE INVENTION

A system and method for providing a server rack system server power latch lockout operation.

In one embodiment, the invention relates to a server power rack latch lockout component, comprising: an attachment portion, the attachment portion being configured to be mounted to a side of a server rack; and, an actuation portion, the actuation portion engaging with a rack ear of a server type information handling system when the server type information handling system is attached to a server rack.

In another embodiment, the invention relates to a server rack comprising: a first side panel; and, a server power rack latch lockout component, the server power rack latch lockout component being mounted to the first side panel of the server rack, the server power rack latch lockout component comprising: an attachment portion, the attachment portion being configured to be mounted to a side of a server rack; and, an actuation portion, the actuation portion engaging with a rack ear of a server type information handling system when the server type information handling system is attached to a server rack.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Various aspects of the disclosure include an appreciation that certain rack mounted server type information handling systems include a blind mate connector accessory for powering the server type information handling system. With these types of server type information handling systems, when the server type information handling system is installed into a rack, the power supply of the server type information handling system docks into an AC receptacle included within the server rack system. Often, the AC receptacle is located towards the rear of the server rack. Such a configuration instantly powers the server type information handling system within a need to access the rear of the server rack and manually connect the power supply. Various aspects of the disclosure include an appreciation that with such a blind mate connector, when the server type information handling system is removed from the rack, power is effectively instantly disconnected. This condition can cause failure and data loss if a customer is unaware of the blind mate power connector.

A system and method for providing a server rack system latch lockout. In certain embodiments the latch lockout is mechanically attached to a rail of the server rack. In certain embodiments, the lockout latch engages with a rack ear, covering a rack latch of the server type information handling system. In certain embodiments, the latch lockout engages with a rack ear of the server type information handling system, covering a rack latch of the server type information handling system. Such a configuration causes a user to actuate the latch lockout out of the way before releasing the system from the rack using a rack latch of the server type information handling system. In certain embodiments, the latch lockout includes a warning label to educate and warn users of potential power loss. In certain embodiments, the server rack system latch lockout is included as part of a rail kit assembly with rail kits which include a blind mate power connector.

Figure 1:
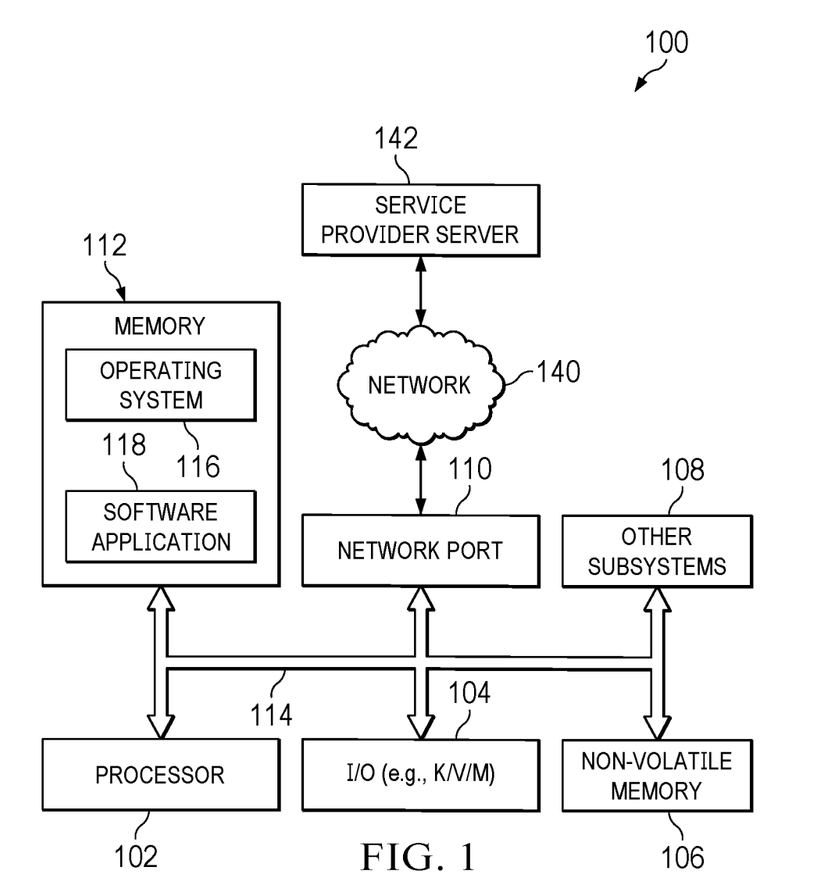
FIG. 1 shows a general illustration of components of an information handling system as implemented in the system and method of the present invention.

FIG. 1 shows a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. The information handling system 100 likewise includes system memory 112, which is interconnected to the foregoing via one or more buses 114. System memory 112 further comprises operating system (OS) 116. In certain embodiments, the information handling system 100 is one of a plurality of information handling systems within a data center. In certain embodiments, the information handling system 100 comprises a server type information handling system. In certain embodiments, the server type information handling system is configured to be mounted within a server rack. In certain embodiments, the other subsystem 108 includes one or more power supplies for supplying power to the other components of the information handling system 100.

Figure 2:
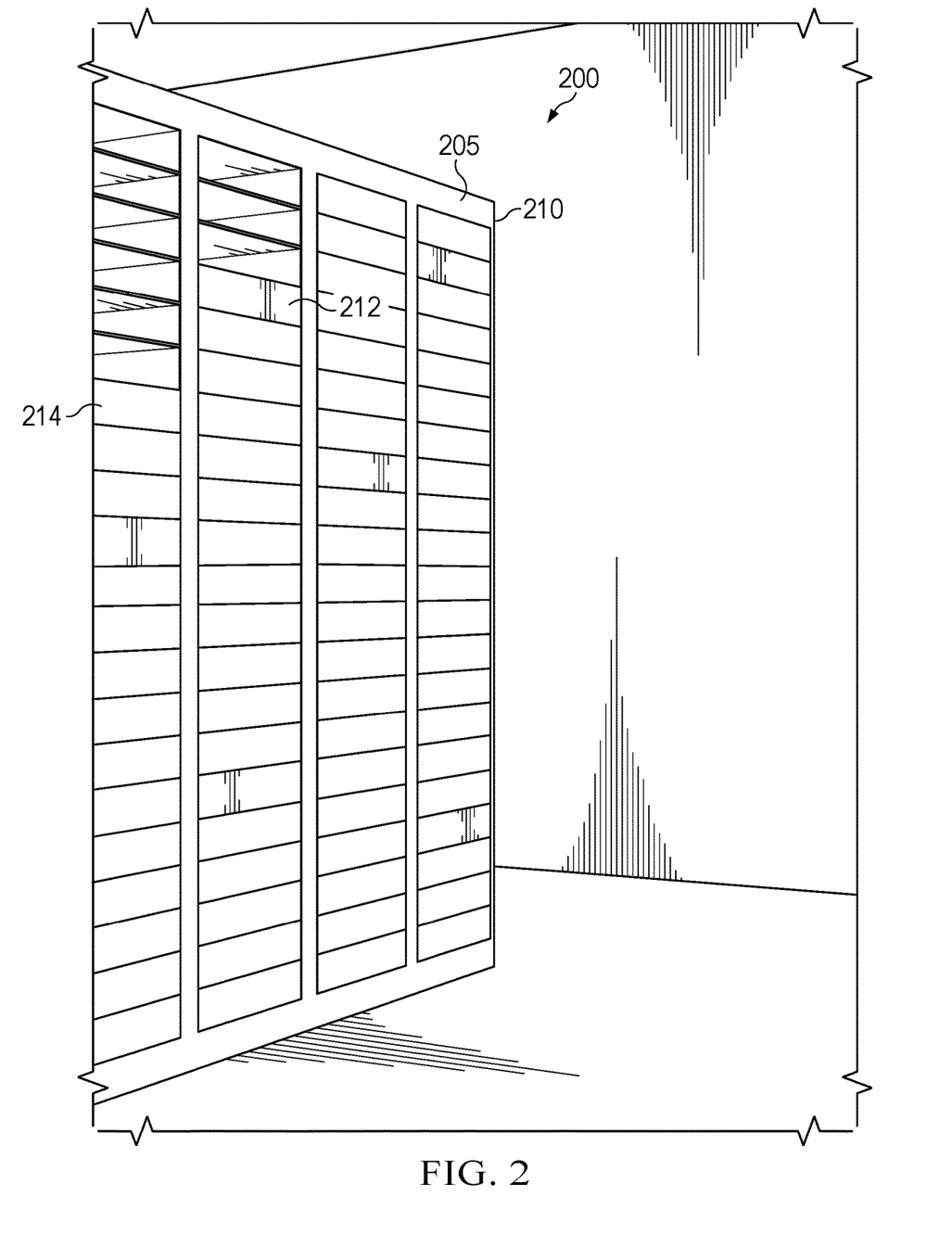
FIG. 2 shows a perspective view of a portion of a data center within an IT environment.

FIG. 2 shows a perspective view of a portion of an IT environment 200. The IT environment includes a one or more racks 205 which include a plurality of information handling systems 100, often referred to as a server rack. In various embodiments, the IT environment 200 comprises a data center. As used herein, a data center refers to an IT environment which includes a plurality of networked information handling systems 100. In various embodiments, the information handling systems 100 of the data center include some or all of router type information handling systems, switch type information handling systems, firewall type information handling systems, storage system type information handling systems, server type information handling systems and application delivery controller type information handling systems. In certain environments, the information handling systems 100 are mounted within respective racks. As used herein a rack refers to a physical structure that is designed to house the information handling systems 100 as well as the associated cabling and power provision for the information handling systems. In certain embodiments, a rack includes side panels to which the information handling systems are mounted. In certain embodiments, the rack includes a top panel and a bottom panel to which the side panels are attached. In certain embodiments, the side panels each include a front side panel and a rear side panel.

Each respective rack includes a plurality of vertically arranged information handling systems. The top most information handling system in each rack is the top of stack information handling system 210, 212, 214. In various embodiments, the top of stack information handling system may be located in the top most slot of the rack (see e.g., information handling system 210 or may be mounted in a slot that is other than the top most slot (see e.g., information handling systems 212, 214). In certain embodiments, information handling systems other than the top most information handling systems are mounted to the rack via static rails. In certain embodiments, the static rails include L shaped brackets on one or both sides of each information handling system. The physical structure provides equipment placement and orchestration within a data center facility.

In certain embodiments, a plurality of racks are arranged continuous with each other to provide a rack system. An IT environment can include a plurality of rack systems arranged in rows with aisles via which IT service personnel can access information handling systems mounted in the racks. In certain embodiments, the aisles can include front aisles via which the front of the information handling systems may be accessed and hot aisles via which the infrastructure (e.g., data and power cabling) of the IT environment can be accessed.

Figure 3:
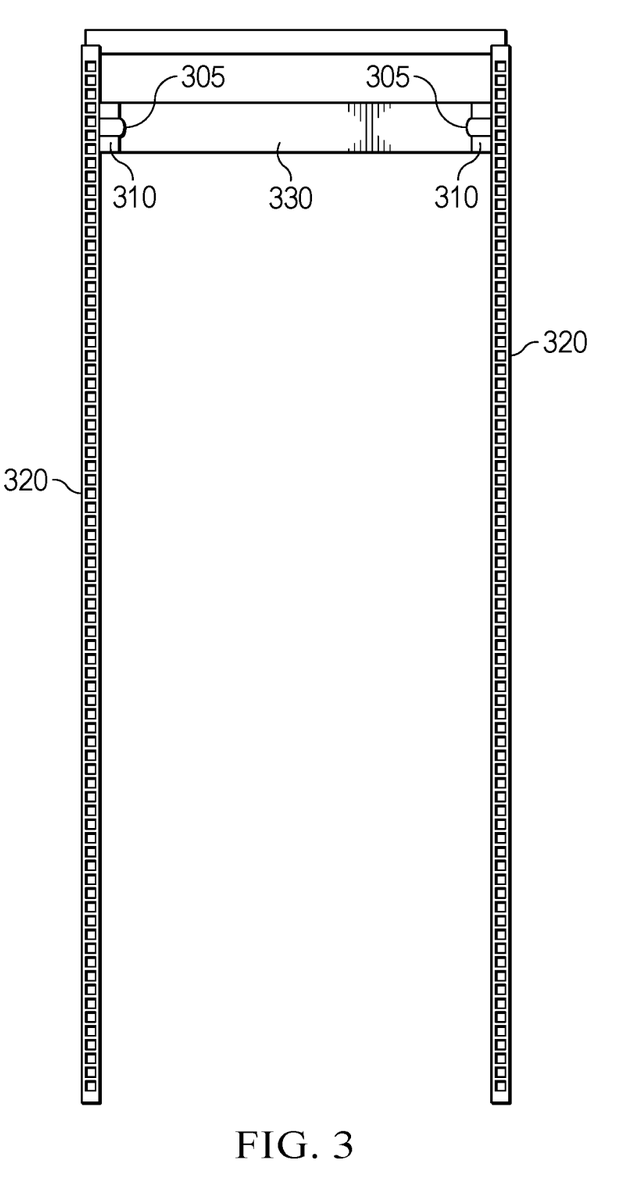
FIG. 3 shows a rack front view.

FIG. 3 shows a front view of a rack system 300 which includes a pair of server rack system server power latch lockout components 305. A mounting component 310 is attached to one side of the rack and a second mounting component is attached to another side of the rack 310. In certain embodiments, the first mounting component is attached to a first front side panel 320 and a first rear side panel of the rack 310. In certain embodiments, the second mounting component is attached to a second front side panel and a second rear side panel. In certain embodiments, a first server rack system server power latch lockout component 305 is attached to the first front side panel 320. In certain embodiments, a second server rack system server power latch lockout component 305 is attached to the second front side panel 320. In certain embodiments, the first server rack system server power latch lockout component and the second server rack system server power latch lockout component are mirror images of each other. In certain embodiments, the server rack system server power latch lockout component performs a server rack system server power lockout operation. As used herein, a server rack system server power lockout operation broadly refers to any function, operation, procedure, or process performed, directly or indirectly, which prevents unintentional removal of a power supply of a server type information handling system from a power source included with the server rack. In certain embodiments, the server rack includes a blind mate power connector and the power source is included within the blind mate power connector.

Figure 4:
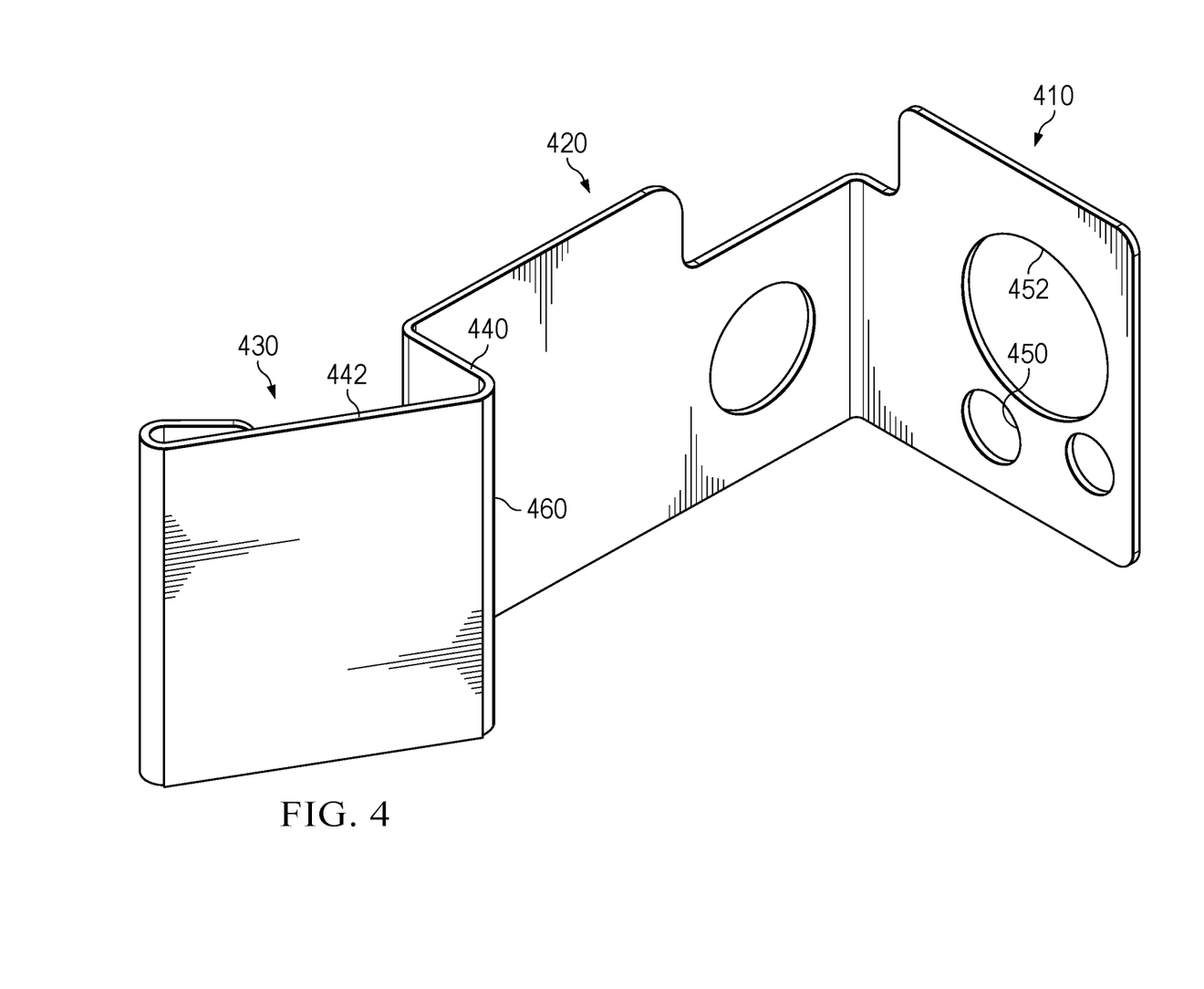
FIG. 4 shows a perspective view of a server rack system server power latch lockout component.

FIG. 4 shows a perspective view of a server rack system server power latch lockout component 400. In certain embodiments, the server power latch lockout component 400 corresponds to server power latch lockout component 305. In certain embodiments, the server power latch lockout component 400 includes an attachment portion 410, a deflection portion 420 and an actuation portion 430. In certain embodiments, the deflection portion 420 is physically coupled between the attachment portion 410 and the actuation portion 430. In certain embodiments, the deflection portion 420 is positioned substantially perpendicular (i.e., +/−10%) relative to the attachment portion 410. In certain embodiments, the actuation portion 430 includes a deflection component attachment portion 440 and an indicia portion 442. In certain embodiments, the deflection component attachment portion 440 is positioned substantially perpendicular (i.e., +/−10%) relative to the deflection portion 410. In certain embodiments, the indicia portion 442 is positioned at an angle relative to the deflection component attachment portion 440. In certain embodiments, the indicia portion 442 is positioned substantially at 45 degree angle (i.e., +/−20%) relative to the deflection component attachment portion 440. In certain embodiments, the angle of the indicia portion 442 facilitates insertion of a server when performing a server attachment operation.

In certain embodiments, the attachment portion 410 defines an aperture 450 via which the server power latch lockout component 400 may be attached to a server rail. In certain embodiments, the attachment portion 410 defines an aperture 452 through which a server alignment component may be inserted when performing a server attachment operation. In certain embodiments, the deflection portion 420 allows the actuation portion 430 to be deflected when a server attachment operation is performed. In certain embodiments, the deflection portion 420 causes the actuation portion 430 to spring back to an original position after a server attachment operation is performed. As used herein, a server attachment operation broadly refers to any function, operation, procedure, or process performed, directly or indirectly, to attach a server type information handling system to a server rack. In certain embodiments the server attachment operation includes a server rack power attachment operation. As used herein a server rack power attachment operation broadly refers to any function, operation, procedure, or process performed, directly or indirectly, to automatically couple a power supply of a server type information handling system with a power source included with the server rack. In certain embodiments, the server rack includes a blind mate power connector and the power source is included within the blind mate power connector.

In certain embodiments, the actuation portion 430 includes a power information indicia 460. In certain embodiments, the power information indication indicia provides an indication that power loss may occur to an associated server. In certain embodiments, the indication that power loss is about to occur include text such as "POWER LOSS." In certain embodiments, the power information indicia includes a warning indicia. In certain embodiments, the warning indicia includes one or both of an exclamation point and a triangle. In certain embodiments, the triangle surrounds the exclamation point as is known in the art as presentation of a serious warning indicia.

Figure 5:
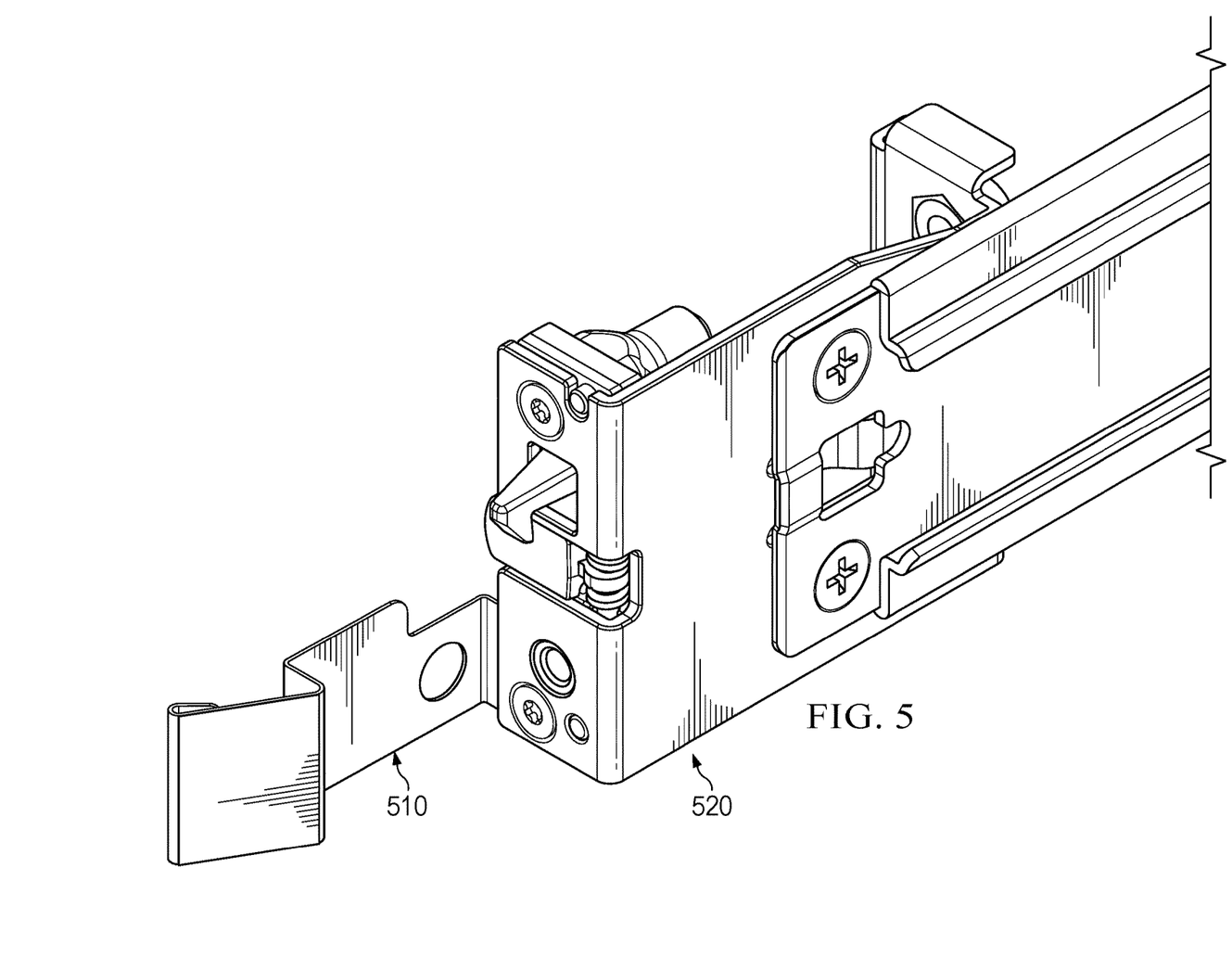
FIG. 5 shows a perspective view of a server power latch lockout component and a front portion of a server rack rail.
Figure 6:
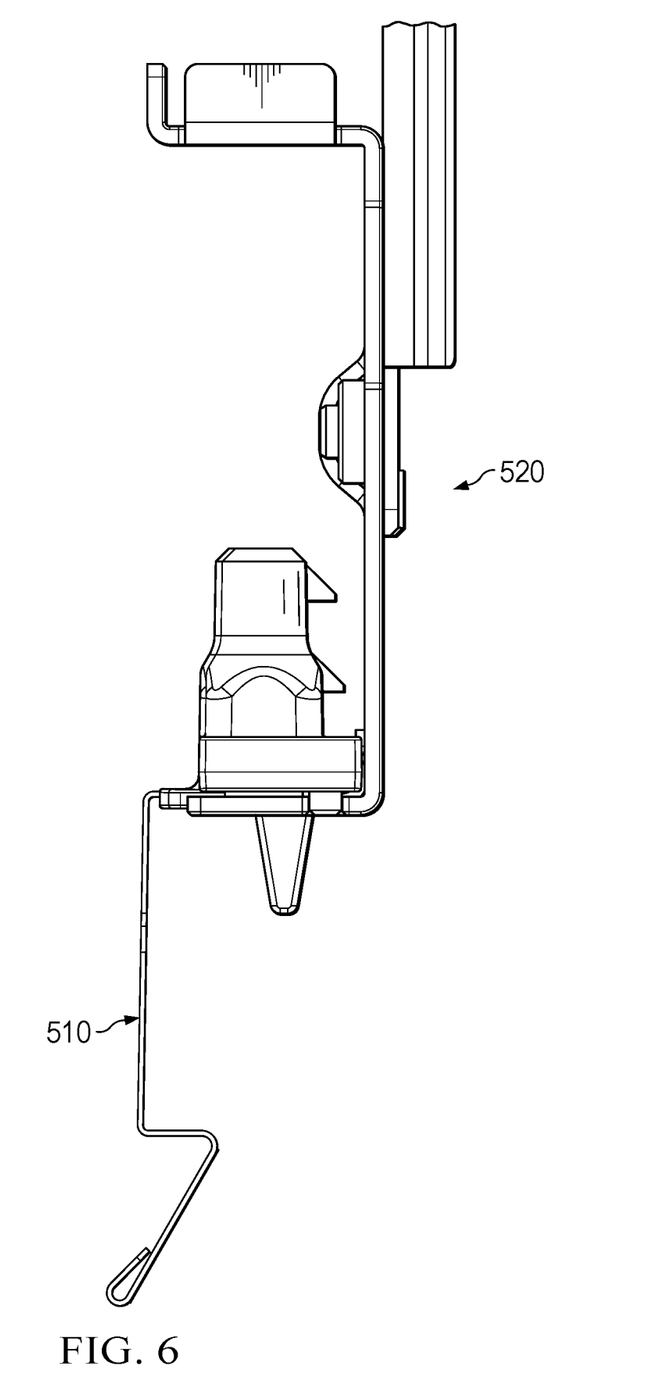
FIG. 6 shows a top view of a server power latch lockout component and a front portion of a server rack rail.
Figure 7:
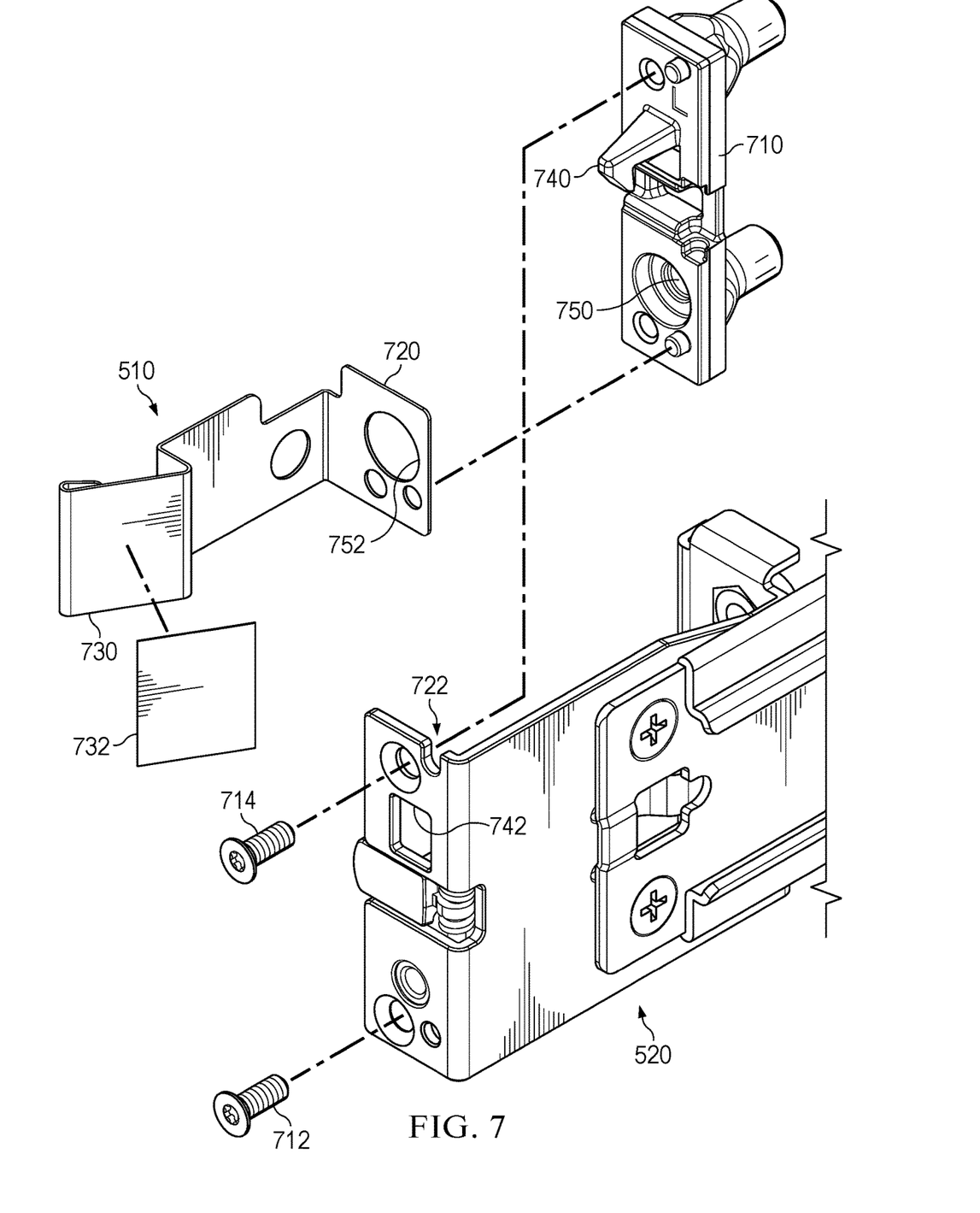
FIG. 7 shows an exploded perspective view of a server power latch lockout component and a front portion of a server rack rail.

FIG. 5 shows a perspective view of a server power latch lockout component 510 and a front portion 520 of a server rack rail. FIG. 6 shows a top view of a server power latch lockout component 510 and a front portion of a server rack rail 520. FIG. 7 shows an exploded perspective view of a server power latch lockout component 510 and a front portion of a server rack rail 520. In certain embodiments, the server power latch lockout component 510 corresponds to server power latch lockout component 305.

In certain embodiments, the rail includes a server insertion lock component 710. In certain embodiments, the server insertion lock component 710 is physically attached to the server rail via fasteners 712, 714. In certain embodiments, fasteners 712, 714 include screws. In certain embodiments, an attachment portion 720 of the visual indication component 510 is positioned between the server insertion lock component 710 and an inside wall 722 of the server rack rail 520.

In certain embodiments, an actuation portion 730 includes an associated information indicia 732. In certain embodiments, the associated information indicia 732 is attached to an angled portion of the actuation portion 730. In certain embodiments, the orientation of the associated information indicia is used to provide a first server rack system server power latch lockout component and a second server rack system server power latch lockout component as mirror images of each other. In certain embodiments, the associated information indicia 732 of the second server rack system server power latch lockout component is effectively upside down relative to the associated information indicia 732 of the first server rack system server power latch lockout component.

In certain embodiments, the server insertion lock component 710 includes a server latch projection 740. In certain embodiments the server latch projection 740 extends through an aperture 742 defined by the server rack rail when the server insertion lock component 710 is attached to the server rail 520. In certain embodiments, the server insertion lock component 710 includes an alignment portion 750. In certain embodiments, the alignment portion 750 defines consecutively smaller concentric circles. In certain embodiments, the consecutively smaller concentric circles guide a projection of a server to align the server with the rack rail when performing a server attachment operation. In certain embodiments, the attachment portion 720 of the visual indication component 510 defines an insertion aperture 752. In certain embodiments, insertion aperture 752 allows the projection of the server to pass through the visual indication component 510 when performing a server attachment operation.

Figure 8A:
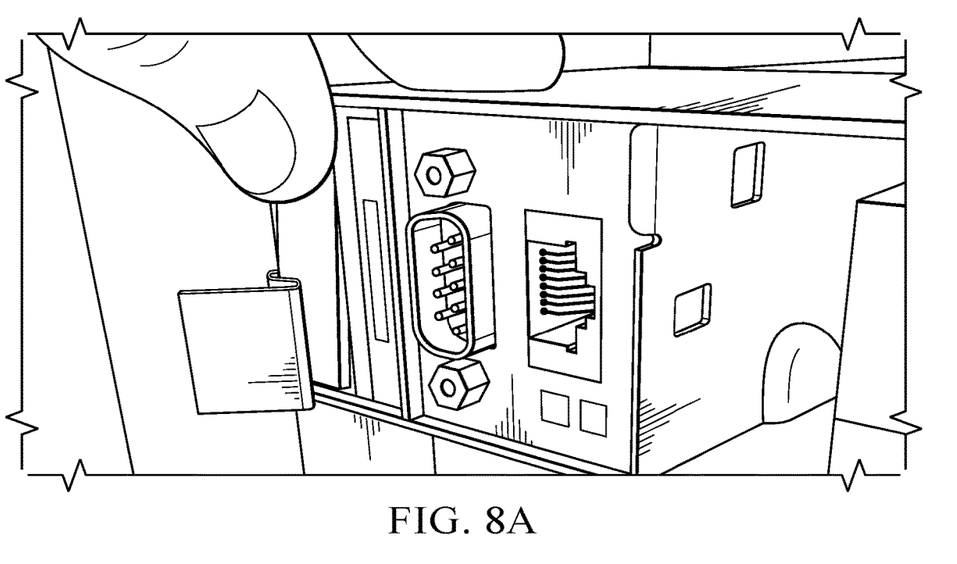
FIGS. 8A, 8B and 8C show operation of a server power latch lockout component when a server is to be uncoupled from a server rack.
Figure 8B:
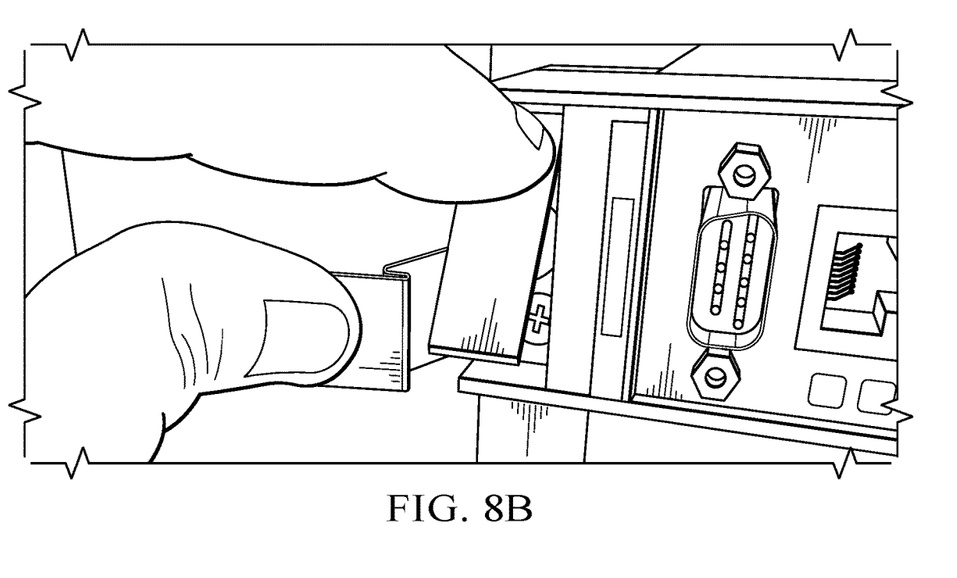
Figure 8C:
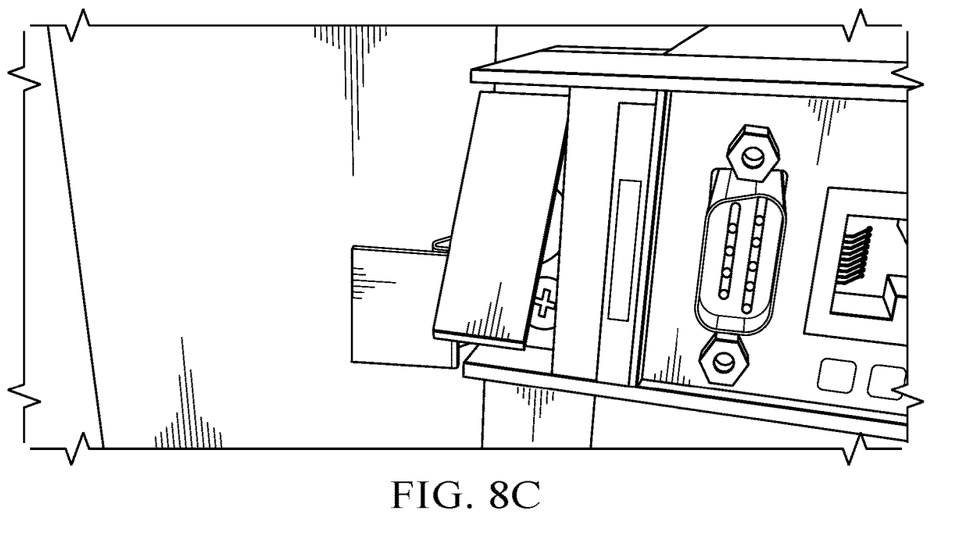

FIGS. 8A, 8B and 8C show operation of a server power latch lockout component when a server is to be uncoupled from a server rack. In certain embodiments, the server is uncoupled from the server rack via a server removal operation.

As used herein a server removal operation broadly refers to any function, operation, procedure, or process performed, directly or indirectly, to remove a server type information handling system to a server rack. In certain embodiments the server remove operation includes a server rack power removal operation. As used herein a server rack power removal operation broadly refers to any function, operation, procedure, or process performed, directly or indirectly, to automatically decouple a power supply of a server type information handling system with a power source included with the server rack. In certain embodiments, the server remove operation is initiated by actuating server rack latch which is engage with a portion of the server rack. In operation, a server removal operation is initiated by actuating the actuation portion 730 of the server power latch lockout component 510.

Figure 9A:
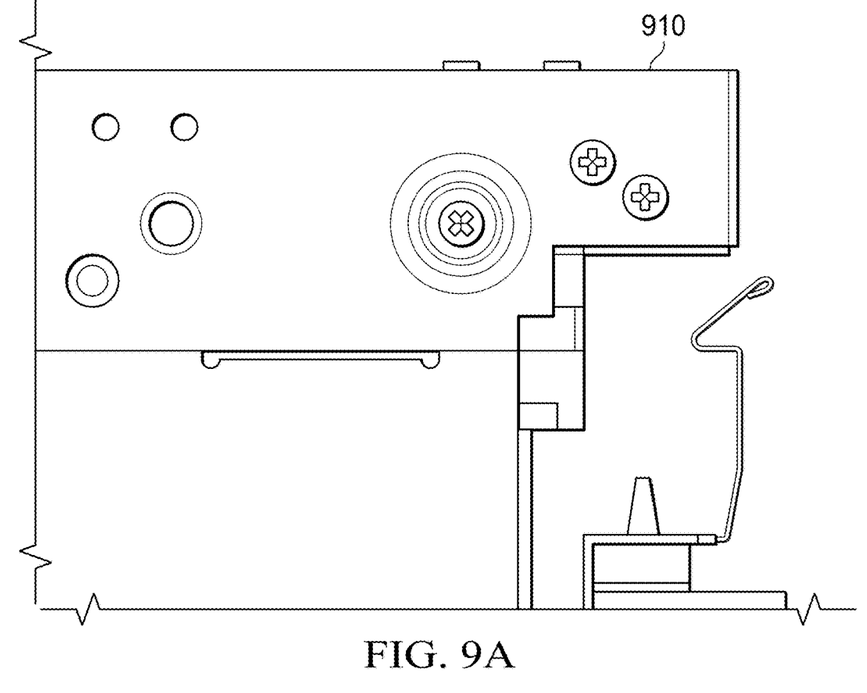
FIGS. 9A, 9B and 9C show operation of a server power latch lockout component when a server is coupled to a server rack.
Figure 9B:
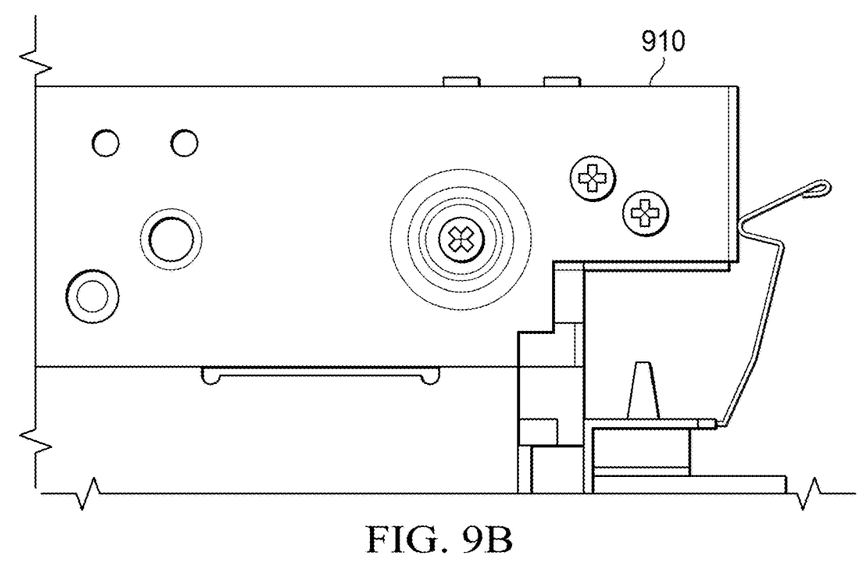
Figure 9C:
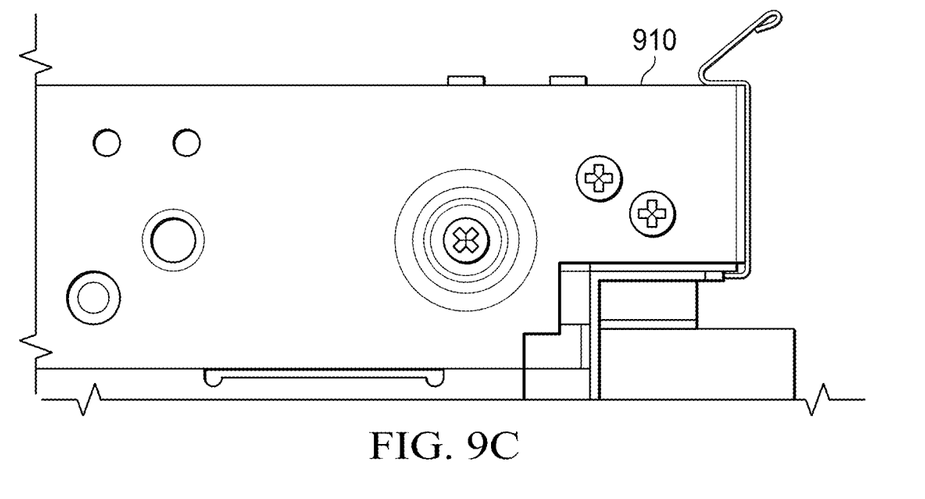

FIGS. 9A, 9B and 9C show operation of a server power latch lockout component when a server is coupled to a server rack. In certain embodiments, the server is coupled to the rack via a server attachment operation. In certain embodiments, as the server is coupled to the server rack, the server power latch lockout component is deflected (see e.g., FIG. 9B). After the attachment of the server is completed, the server power latch lockout component returns to its original orientation, thus "locking" the server with the server rack. For the server to be removed from the server rack (thus causing power to be removed from the server), the server power latch lockout component must be deflected (see e.g., FIGS. 8A, 8B and 8C).

In certain embodiments, engaging the rack ear 910 of the server type information handling system by the actuation portion of the server power rack latch lockout component prevents accidental removal of power from the server type information handling system. In certain embodiments, the actuation portion of the server power latch lockout component engages the rack ear of the server type information handling system. In certain embodiments, the deflection component attachment portion of the actuation portion is substantially parallel with an edge of the rack ear.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A server power rack latch lockout component, comprising:
    an attachment portion, the attachment portion being configured to be mounted to a side of a server rack;
    an actuation portion, the actuation portion engaging with a rack ear of a server type information handling system when the server type information handling system is attached to the server rack; and,
    a deflection portion physically coupled between the attachment portion and the actuation portion; and wherein
    the deflection portion is positioned substantially perpendicular relative to the attachment portion; and,
    the deflection portion is substantially parallel with an edge of the rack ear of the server type information handling system when the server type information handling system is attached to the server rack.

2. The server power rack latch lockout component of claim 1, wherein:
    the server rack includes a blind mate power connector; and,
    engaging the rack ear of the server type information handling system by the actuation portion of the server power rack latch lockout component prevents accidental removal of power from the server type information handling system.

3. The server power rack latch lockout component of claim 2, wherein:
    the server rack system latch lockout is included as part of a rail kit assembly with rail kits which include the blind mate power connector.

4. The server power rack latch lockout component of claim 1, wherein:
    the actuation portion includes a deflection component attachment portion; and,
    the deflection component attachment portion is positioned substantially perpendicular to the deflection portion.

5. The server power rack latch lockout component of claim 1, wherein:
    the actuation portion includes a power information indica, the power information indicia providing an indication that power loss may occur to an associated server.

6. A server rack comprising:
    a first side panel; and,
    a server power rack latch lockout component, the server power rack latch lockout component being mounted to the first side panel of the server rack, the server power rack latch lockout component comprising:
        an attachment portion, the attachment portion being configured to be mounted to a side of a server rack;
        an actuation portion, the actuation portion engaging with a rack ear of a server type information handling system when the server type information handling system is attached to the server rack; and,
        a deflection portion physically coupled between the attachment portion and the actuation portion; and wherein
        the deflection portion is positioned substantially perpendicular relative to the attachment portion; and,
        the deflection portion is substantially parallel with an edge of the rack ear of the server type information handling system when the server type information handling system is attached to the server rack.

7. The server rack of claim 6, wherein:
    the server rack includes a blind mate power connector; and,
    engaging the rack ear of the server type information handling system by the actuation portion of the server power rack latch lockout component prevents accidental removal of power from the server type information handling system.

8. The server rack of claim 7, wherein:
    the server rack system latch lockout is included as part of a rail kit assembly with rail kits which include the blind mate power connector.

9. The server rack of claim 6, wherein:
    the actuation portion includes a deflection component attachment portion; and,
    the deflection component attachment portion is positioned substantially perpendicular to the deflection portion.

10. The server rack of claim 6, wherein:
    the actuation portion includes a power information indica, the power information indicia providing an indication that power loss may occur to an associated server.

* * * * *